(12) United States Patent
Yang

(10) Patent No.: US 11,621,371 B2
(45) Date of Patent: Apr. 4, 2023

(54) EPITAXIAL STRUCTURE, PREPARATION METHOD THEREOF, AND LED

(71) Applicant: CHONGQING KONKA PHOTOELECTRIC TECHNOLOGY RESEARCH INSTITUTE CO., LTD., Chongqing (CN)

(72) Inventor: Shungui Yang, Guangdong (CN)

(73) Assignee: CHONGQING KONKA PHOTOELECTRIC TECHNOLOGY RESEARCH INSTITUTE CO., LTD., Chongqing (CN)

(*) Notice: Subject to any disclaimer, the term of this patent is extended or adjusted under 35 U.S.C. 154(b) by 74 days.

(21) Appl. No.: 17/055,887

(22) PCT Filed: Sep. 30, 2019

(86) PCT No.: PCT/CN2019/109724
§ 371 (c)(1),
(2) Date: Nov. 16, 2020

(87) PCT Pub. No.: WO2021/062799
PCT Pub. Date: Apr. 8, 2021

(65) Prior Publication Data
US 2021/0305455 A1 Sep. 30, 2021

(51) Int. Cl.
*H01L 33/24* (2010.01)
*H01L 33/32* (2010.01)
*H01L 33/00* (2010.01)

(52) U.S. Cl.
CPC .......... *H01L 33/325* (2013.01); *H01L 33/007* (2013.01); *H01L 33/0095* (2013.01); *H01L 33/24* (2013.01)

(58) Field of Classification Search
CPC . H01L 33/007; H01L 33/0095; H01L 33/025; H01L 33/145; H01L 33/20; H01L 33/24; H01L 33/32; H01L 33/325
See application file for complete search history.

(56) References Cited

U.S. PATENT DOCUMENTS

| 6,442,184 B1 | 8/2002 | Ota et al. |
| 6,555,846 B1 * | 4/2003 | Watanabe ........... H01L 21/0242 257/190 |

(Continued)

FOREIGN PATENT DOCUMENTS

| CN | 101241851 A | 8/2008 |
| CN | 102456777 A | 5/2012 |

(Continued)

OTHER PUBLICATIONS

Chinese Office Action issued in corresponding Chinese Application No. 201980002001.0, dated Jun. 1, 2021, pp. 1-7.

(Continued)

*Primary Examiner* — Julia Slutsker
*Assistant Examiner* — Dmitriy Yemelyanov
(74) *Attorney, Agent, or Firm* — Hauptman Ham, LLP

(57) ABSTRACT

An epitaxial structure, a preparation method thereof, and a light-emitting diode (LED) are provided. The epitaxial structure includes a sapphire substrate, a GaN layer, a defect exposure layer, and a defect termination layer stacked in sequence.

20 Claims, 6 Drawing Sheets

(56) References Cited

U.S. PATENT DOCUMENTS

| | | | |
|---|---|---|---|
| 2002/0005593 A1* | 1/2002 | Bourret-Courchesne | ..................... C30B 25/02 257/E21.112 |
| 2005/0042789 A1* | 2/2005 | Fujikura | ............. H01L 21/0242 257/E21.108 |
| 2008/0153191 A1* | 6/2008 | Grillot | ................ H01L 21/0242 438/35 |
| 2015/0064881 A1 | 3/2015 | Yvon | |
| 2016/0172539 A1* | 6/2016 | Heo | ...................... H01L 33/025 257/79 |

FOREIGN PATENT DOCUMENTS

| | | | | |
|---|---|---|---|---|
| CN | 104900774 A | * | 9/2015 | ........... H01L 33/005 |
| CN | 104900774 A | | 9/2015 | |
| JP | 2000277803 A | | 10/2000 | |
| KR | 20070082842 A | * | 8/2007 | |

OTHER PUBLICATIONS

International Search Report issued in corresponding International Application No. PCT/CN2019/109724, dated May 28, 2020, pp. 1-8, Beijing, China.

\* cited by examiner

EPITAXIAL STRUCTURE, PREPARATION METHOD THEREOF, AND LED

RELATED APPLICATION

The present application is a U.S. National Phase of International Application Number PCT/CN2019/109724, filed Sep. 30, 2019.

TECHNICAL FIELD

This disclosure relates to the technical field of epitaxial structure, and particularly to an epitaxial structure, a preparation method thereof, and a light-emitting diode (LED).

BACKGROUND

A light-emitting diode (LED) is a semiconductor electronic device that emits light. A composite light source composed of trivalent and pentavalent elements can be used in a variety of fields such as lighting, advertising billboards, mobile phone backlights, and so on. At present, materials used to make LEDs include InGaN. The existing blue-green LEDs are mainly made from InGaN grown by metal-organic chemical vapor deposition (MOCVD) machine on a sapphire substrate. However, this preparation method will cause many defects ($10^{-9}$ cm$^{-2}$~$10^{-10}$ cm$^{-2}$) due to stacking of different materials (i.e., heterogeneous epitaxy), which in turn affects recombination efficiency of electrons and holes and reduces overall luminous efficiency of the device. In other words, an epitaxy is roughly divided into a homogeneous epitaxy (i.e., material A is grown on a substrate made of material A) and a heterogeneous epitaxy (i.e., material A is grown on a substrate made of material B). At present, in a GaN-based LED preparation process, a GaN material is grown on a sapphire substrate. Since a mismatch rate of lattice constants between the GaN material and the sapphire substrate is up to 14%, GaN growing on the sapphire substrate will cause stress and material defects. These defects can cause floating bonds, which affects capture of electrons or holes, resulting in poor recombination efficiency of electrons and holes, thereby reducing overall luminous efficiency of the device.

In sum, the existing technology needs to be improved and developed.

SUMMARY

In view of the above deficiencies in the related art, an epitaxial structure, a preparation method thereof, and a light-emitting diode (LED) are provided, which aims to solve problems of defects in the related art when GaN is grown on a sapphire substrate.

Technical solutions are as follows.

An epitaxial structure is provided. The epitaxial structure includes a sapphire substrate, a GaN layer, a defect exposure layer, and a defect termination layer stacked in sequence.

In one implementation, the GaN layer is a high temperature undoped GaN layer, the defect exposure layer is a low temperature undoped GaN layer or a low temperature undoped InGaN layer, and the defect termination layer is an island-shaped doped GaN layer.

In one implementation, the island-shaped doped GaN layer is an island-shaped silicon-doped GaN layer or an island-shaped magnesium-doped GaN layer, and the island-shaped doped GaN layer has a doping concentration greater than $10^{19}$ cm$^{-3}$.

In one implementation, the epitaxial structure further includes an n-type GaN layer, a light-emitting layer, an electron-blocking layer (EBL), and a p-type GaN layer which are sequentially stacked on the defect termination layer.

A light-emitting diode (LED) is provided. The LED includes the epitaxial structure as described in the foregoing implementations.

A method for preparing the epitaxial structure as described in the foregoing implementations is provided. The method includes the following. A sapphire substrate is prepared. A GaN layer is grown on the sapphire substrate. A defect exposure layer is grown on the GaN layer. A defect termination layer is grown on the defect exposure layer.

In one implementation, the GaN layer is grown on the sapphire substrate as follows. Amorphous GaN is grown on the sapphire substrate. Perform heat treatment on the amorphous GaN to obtain single crystal GaN, where the heat treatment is performed at a temperature of 950° C.-1050° C. The GaN layer is grown by using the single crystal GaN as a seed crystal.

In one implementation, the defect exposure layer is grown on the GaN layer as follows. GaN or InGaN is grown on the GaN layer to obtain the defect exposure layer, where the GaN or InGaN is grown at a temperature of 600° C.-800° C. and with a V-III ratio of 1000-2500. The defect termination layer is grown on the defect exposure layer as follows. Doped GaN is grown on the defect exposure layer to obtain the defect termination layer, where the doped GaN is grown at a temperature of 1000° C.-1100° C. and with a V-III ratio of 4500-7500.

In one implementation, silicon or magnesium is doped in growing of the doped GaN, and the doped GaN has a doping concentration greater than $10^{19}$ cm$^{-3}$.

In one implementation, the method further includes the following. An n-type GaN layer, a light-emitting layer, an electron-blocking layer (EBL), and a p-type GaN layer are grown on the defect termination layer sequentially.

Advantageous effects: according to the disclosure, after a buffer layer (i.e., the GaN layer) is prepared on the sapphire substrate, defects in the buffer layer are enlarged and exposed in the defect exposure layer. Then directions of the defects are changed in the defect termination layer, and the defects do not continue to expand. In this way, subsequent layers will not form relatively large defects on the basis of the defects in the buffer layer when the subsequent layers are continuously prepared on the defect termination layer.

DETAILED DESCRIPTION

In order to clearly and accurately describe the objects, technical solutions, and advantages of the disclosure, the disclosure will be described below in details with reference to accompanying drawings and implementations. It should be understood that, specific implementations herein are merely used to explain the disclosure, and should not be construed as limiting the disclosure.

Hereinafter, implementations to facilitate the understanding of an epitaxial structure of the disclosure are provided with reference to FIG. 3 to FIG. 6.

Figure 1:
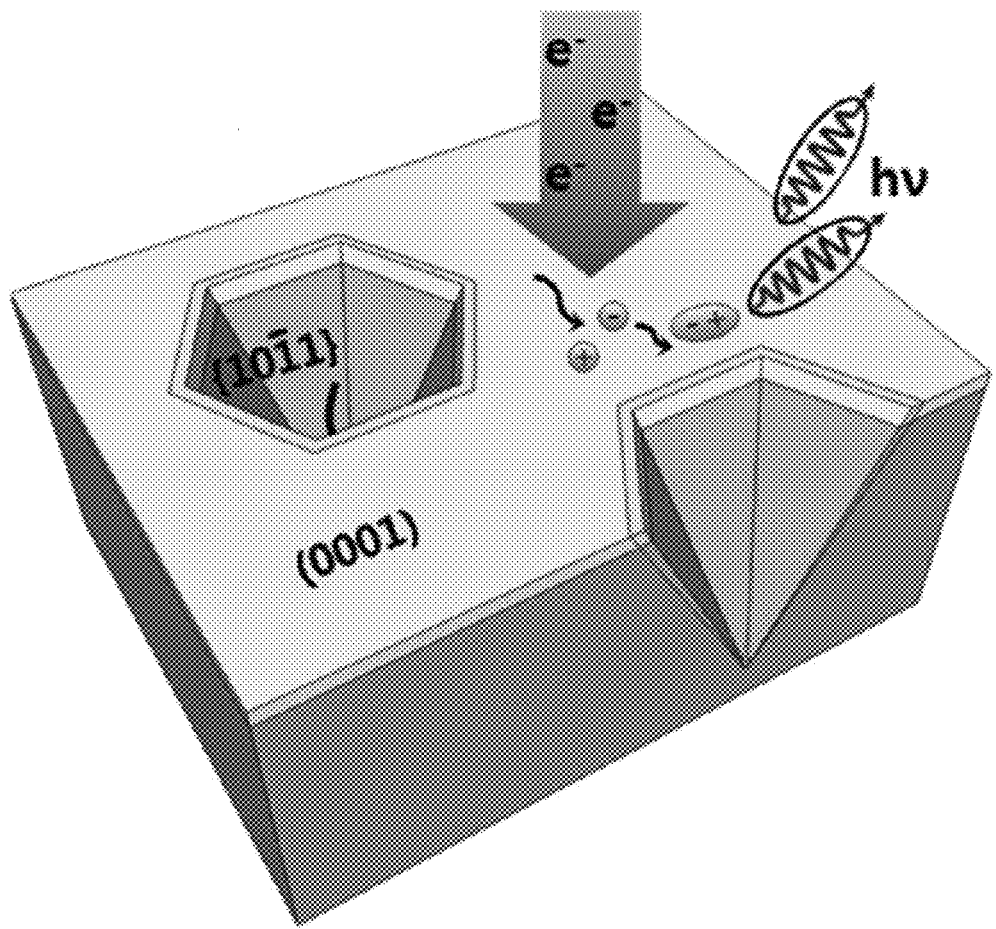
FIG. 1 is a schematic diagram illustrating a structure with defects in the related art.
Figure 2:
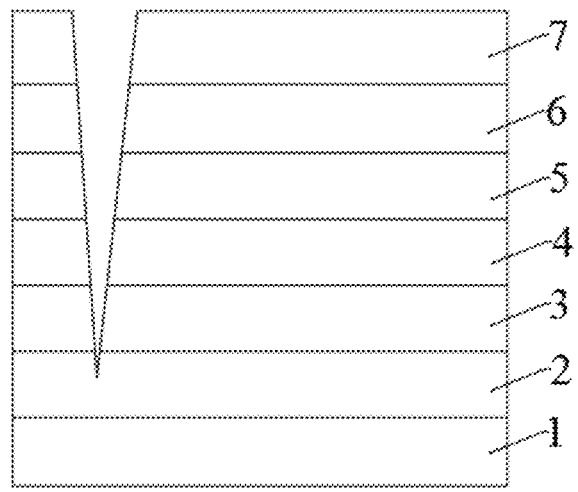
FIG. 2 is a schematic diagram illustrating an epitaxial structure in the related art.

Generally, as illustrated in FIG. 1 and FIG. 2, an epitaxial structure includes a sapphire substrate 1, an undoped GaN layer (i.e., a buffer layer 2), an N-type GaN layer 3, a stress relief layer 4, a light-emitting layer 5 (a multi-quantum well (MQW) layer), an EBL layer 6 (i.e., an electron-blocking layer, such as a p-type AlGaN layer), and a p-type GaN layer 7 which are stacked in sequence. Since GaN of the buffer layer 2 does not match the sapphire substrate 1 in terms of lattice constants, there is stress when GaN is grown on the sapphire substrate 1, which results in many defects (i.e., V-pits, pits with a V-shaped). Generally, the density of the defects is $10^9$-$10^{10}$ cm$^{-2}$ (i.e., $10^9$-$10^{10}$ defects per square centimeter area). During growing of subsequent layers, the subsequent layers will continue to grow on the basis of a lattice with V-pits. As a result, the V-pits extend to the outermost P-GaN layer, and the size of the V-pits becomes larger and larger with the extension. It should be noted that, once there are defects in the epitaxial structure, electrons and holes take a shortest path (i.e., a defect path or a leakage path) and do not pass through the light-emitting layer 5, such that the epitaxial structure will not emit lights and an initial voltage is abnormally low, so that the device cannot operate normally.

Figure 3:
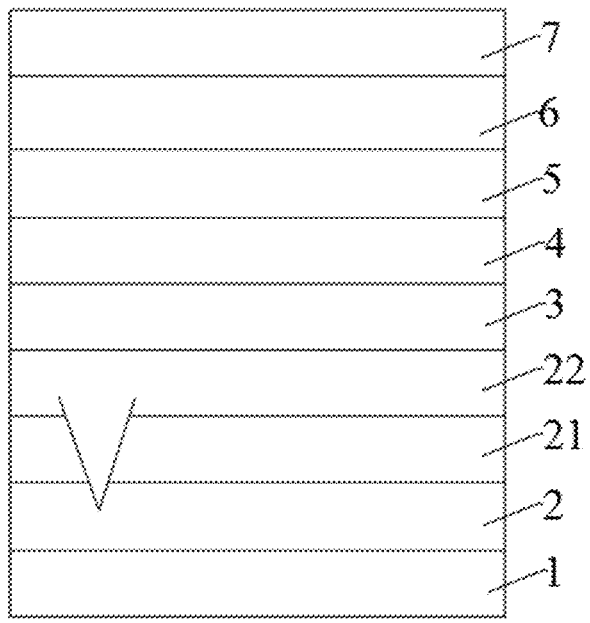
FIG. 3 is a schematic diagram illustrating an epitaxial structure of the disclosure.

As illustrated in FIG. 3, an epitaxial structure of the disclosure includes: a sapphire substrate 1, a GaN layer, a defect exposure layer 21, and a defect termination layer 22 arranged in sequence.

According to the disclosure, after the buffer layer 2 (i.e., the GaN layer) is prepared on the sapphire substrate 1, defects in the buffer layer 2 are enlarged and exposed in the defect exposure layer 21. Then directions of the defects are changed in the defect termination layer 22, and the defects are stopped from expanding. In this way, when the subsequent layers (e.g., the N-type GaN layer 3, the stress relief layer 4, the multi-quantum well layer, the electron-blocking layer, the p-type AlGaN layer, and the p-type GaN layer 7) are continuously prepared on the defect termination layer 22, they will not form relatively large V-pits on the basis of V-pits of the buffer layer 2.

Figure 4:
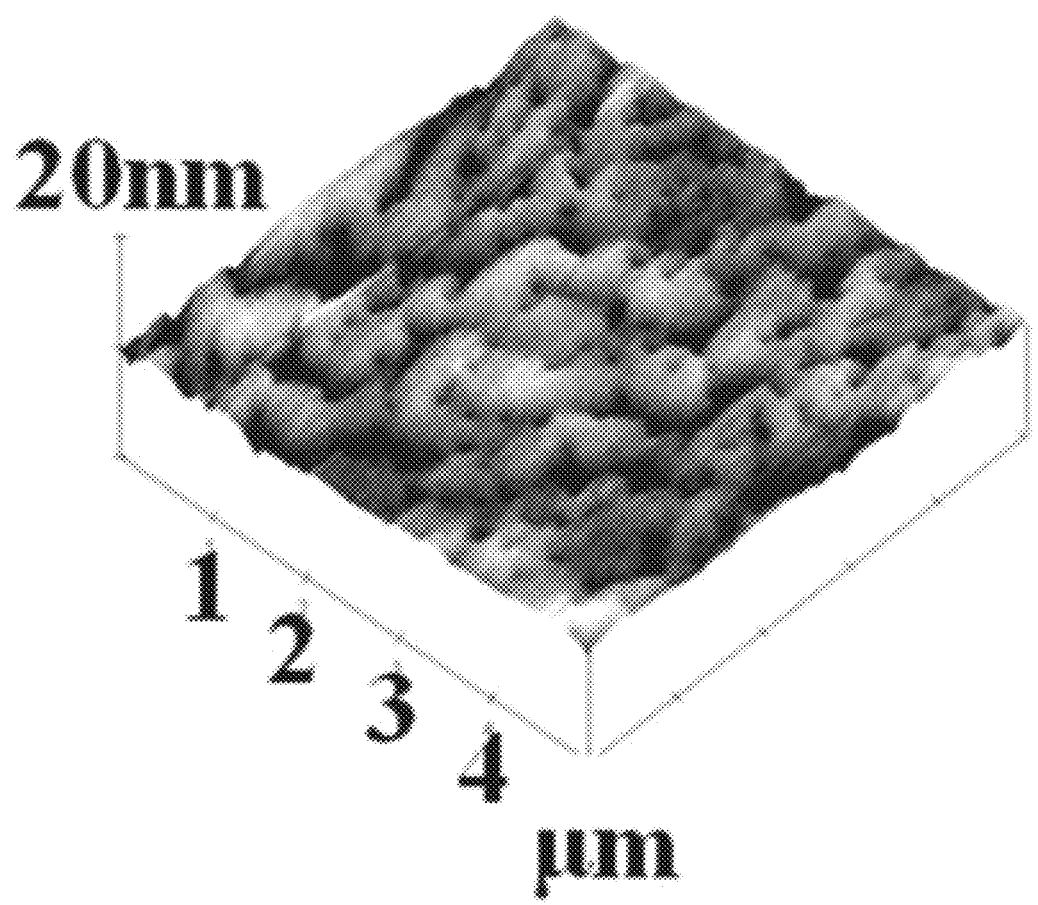
FIG. 4 is an atomic force microscope (AFM) image illustrating an epitaxial structure in the related art.
Figure 5:
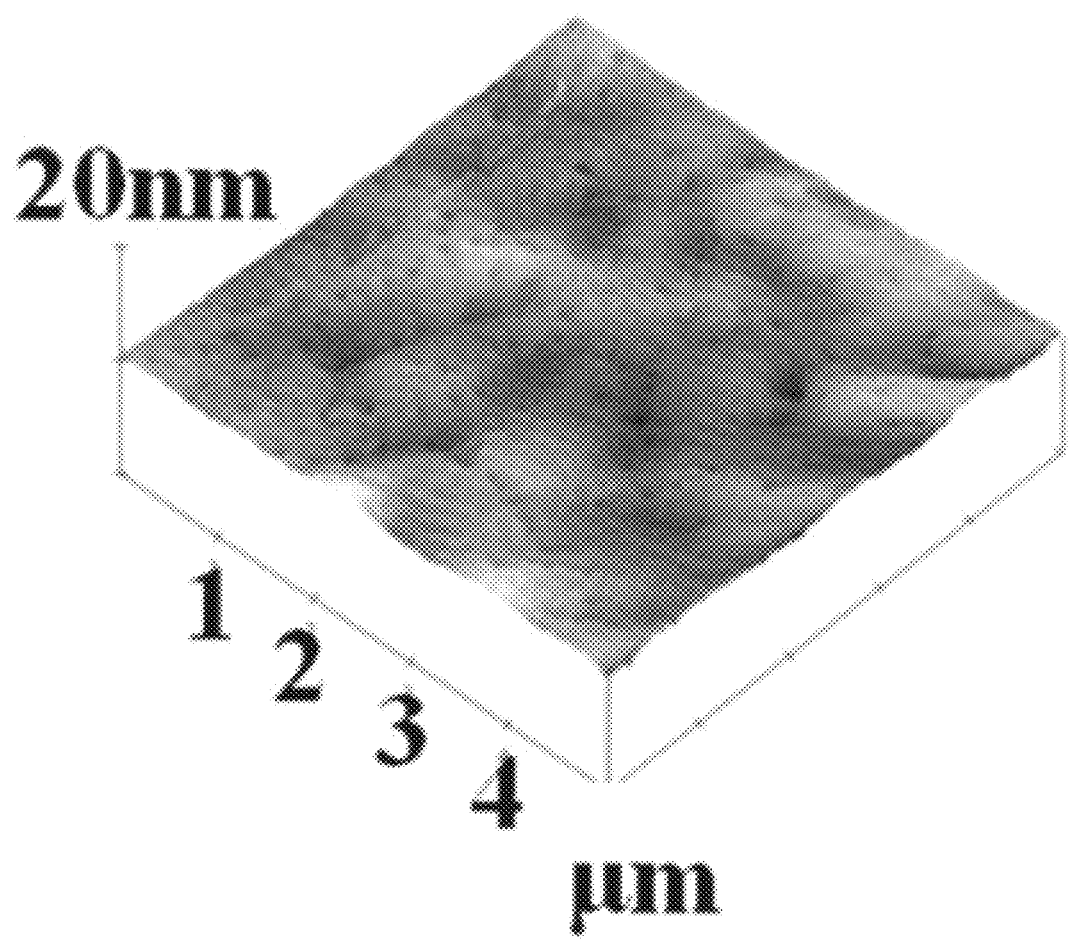
FIG. 5 is an AFM image illustrating an epitaxial structure of the disclosure.

As illustrated in FIG. 4, there are multiple V-pits in an atomic force microscope (AFM) image of an existing epitaxial structure (including subsequent layers). In contrast, as illustrated in FIG. 5, there is no V-pit in an AFM image of an epitaxial structure (including the subsequent layers) of the disclosure.

In one implementation of the disclosure, the GaN layer is a high temperature undoped GaN layer, the defect exposure layer 21 is a low temperature undoped GaN layer or a low temperature undoped InGaN layer, and the defect termination layer 22 is an island-shaped doped GaN layer.

The "high temperature" and "low temperature" herein are relative terms. That is, compared to a temperature for preparing the GaN or InGaN of the defect exposure layer 21, the GaN of the buffer layer 2 is prepared at a high temperature, and the temperature is in a range of 950° C.-1050° C. for example. Compared to a temperature for preparing the GaN of the buffer layer 2, the GaN or InGaN of the defect exposure layer 21 is prepared at a low temperature, and the temperature is in a range of 600° C.-800° C. for example.

The GaN or InGaN is prepared at a low temperature, which is beneficial to enlarging the V-pits in the buffer layer 2, that is, the size of openings of the V-pits can be enlarged. As such, the V-pits can be exposed in advance, so that the exposed V-pits can be terminated by the defect termination layer 22.

Figure 6:
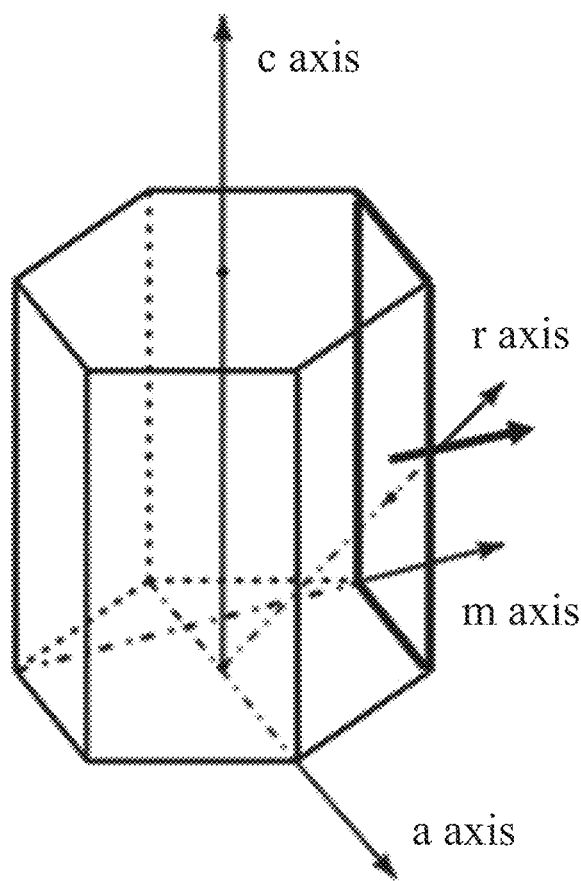
FIG. 6 is a schematic structural diagram illustrating a GaN unit cell of the disclosure.

As illustrated in FIG. 6, GaN is a hexagonal crystal system (i.e., a unit cell of GaN is in a shape of a hexagonal prism). Growth rates of GaN along a c-axis and an a-axis are fixed. In the defect termination layer 22, doped GaN is adopted to form an island-shaped structure, that is, an island-shaped doped GaN layer. Since the GaN herein is doped, the growth rate of GaN along the c-axis is different from the growth rate of GaN along the a-axis. Specifically, as a doping concentration increases, the growth rate of GaN along the a-axis gradually increases while the growth rate of GaN along the c-axis gradually decreases. In the epitaxial structure, the c-axis is perpendicular to the sapphire substrate 1, and the a-axis is parallel to the sapphire substrate 1. As the growth rate of doped GaN along the a-axis increases and the growth rate of the doped GaN along the c-axis decreases, the doped GaN tends to grow sideways and expand in a horizontal direction. The V-pits turns as the doped GaN tends to grow sideways. Therefore, the V-pits will not extend into subsequent layers, nor will a larger size V-pits be formed.

In one implementation of the disclosure, the island-shaped doped GaN layer is an island-shaped silicon-doped GaN layer or an island-shaped magnesium-doped GaN layer. The island-shaped doped GaN layer has a doping concentration greater than $10^{19}$ cm$^{-3}$.

For example, a silicon source is silane (SiH$_4$), and a magnesium source is magnesium cerene (Cp$_2$Mg). A silicon or magnesium concentration (i.e., the doping concentration) is greater than $10^{19}$ cm$^{-3}$. In other words, the amount of Si atoms replacing Ga atoms in each cubic centimeter volume is greater than $10^{20}$. Since a Si atom has one more electron than a Ga atom in atomic periphery, doped GaN is the main electron supply material.

In one implementation of the disclosure, as illustrated in FIG. 3, the epitaxial structure further includes an N-type GaN layer 3, a light-emitting layer 5, an EBL layer 6, a p-type GaN layer 7 which are stacked on the defect termination layer 22 sequentially. In another implementation, a stress relief layer 4 is provided between the N-type GaN layer 3 and the light-emitting layer 5.

Based on the above epitaxial structure, a light-emitting diode (LED) is further provided according to implementations of the disclosure. The LED of the implementations of the disclosure includes the epitaxial structure as described in any of the foregoing implementations.

Figure 7:
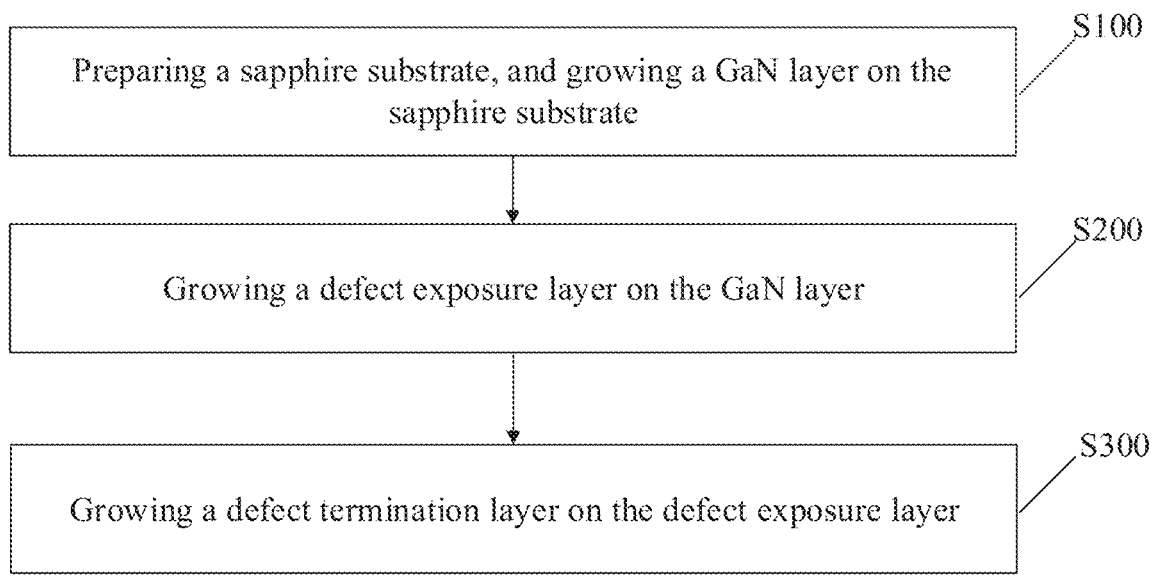
FIG. 7 is a schematic flowchart illustrating a method for preparing an epitaxial structure of the disclosure.

Based on the above epitaxial structure, a method for preparing an epitaxial structure is further provided according to implementations of the disclosure. As illustrated in FIG. 7, the method of the implementations of the disclosure includes the following.

At block S100, a sapphire substrate 1 is prepared, and a GaN layer is grown on the sapphire substrate 1.

In one implementation, the operations at block S100 include the following.

At S110, the sapphire substrate 1 is prepared.

At S120, amorphous GaN is grown on the sapphire substrate 1.

At S130, perform heat treatment on the amorphous GaN to obtain single crystal GaN, where the heat treatment is performed at a temperature of 950° C.-1050° C.

At S140, the GaN layer is grown by using the single crystal GaN as a seed crystal.

At block S200, a defect exposure layer 21 is grown on the GaN layer.

In one implementation, the operations at block S200 include the following.

At S210, GaN or InGaN is grown on the GaN layer to obtain the defect exposure layer 21, where the GaN or InGaN is grown at a temperature of 600° C.-800° C., with a V-III ratio (a molar ratio of an N source and Ga+In sources) of 1000-2500, and under a growth pressure of 300 torr-400 torr. The N source herein uses ammonia gas, the Ga source uses trimethylgallium or triethylgallium, and the In source uses trimethylindium.

For example, the defect exposure layer 21 is a low temperature undoped GaN layer or a low temperature undoped InGaN layer. The specific composition of the low temperature undoped InGaN layer is $In_xGa_{1-x}N$ ($0.2 \le x \le 0.35$). The defect exposure layer 21 has a thickness in a range of 0.5 μm-1 μm.

At block S300, a defect termination layer 22 is grown on the defect exposure layer 21.

In one implementation, the operations at block S300 include the following.

At S310, doped GaN is grown on the defect exposure layer 21 to obtain the defect termination layer 22, where the doped GaN is grown at a temperature of 1000° C.-1100° C. and with a V-III ratio of 4500-7500.

The thickness of the defect termination layer 22 is 1 μm-1.5 μm for example. The grown doped GaN is doped with silicon or magnesium, and has a doping concentration greater than $10^{19}$ cm$^{-3}$. The doping concentration increases with time of the extension. That is, as the defect termination layer 22 grows, the concentration of a doping source increases.

At S400, an N-type GaN layer 3, a light-emitting layer 5, an EBL layer 6, and a p-type GaN layer 7 are sequentially grown on the defect termination layer 22.

In one implementation, a stress relief layer 4 is grown between the N-type GaN layer 3 and the light-emitting layer 5.

In sum, according to the disclosure, an epitaxial structure, a preparation method thereof, and an LED are provided. The epitaxial structure includes the sapphire substrate, the GaN layer, the defect exposure layer, and the defect termination layer which are stacked in sequence. After the buffer layer (i.e., the GaN layer) is prepared on the sapphire substrate, defects in the buffer layer are enlarged and exposed in the defect exposure layer. Then directions of the defects are changed in the defect termination layer, and the defects do not continue to expand. In this way, subsequent layers will not form relatively large defects on the basis of the defects in the buffer layer when the subsequent layers are continuously prepared on the defect termination layer.

It is to be understood that, the disclosure is not limited to foregoing illustrative implementations. Those of ordinary skill in the art are able to make several improvements and changes, and these improvements and changes are also deemed as falling in the protection scope of the disclosure.

What is claimed is:

1. An epitaxial structure, comprising:
   a sapphire substrate, a GaN layer, a defect exposure layer, and a defect termination layer stacked in sequence, wherein
   defects are generated in from the GaN layer caused by lattice constant mismatch between the GaN layer and sapphire substrate, and extend to the defect termination layer through the defect exposure layer,
   the defect exposure layer is configured to enlarge and expose the defects in the GaN layer,
   the defect termination layer is configured to change directions of the defects in the defect termination layer and stop the defects from expanding,
   the GaN layer is a high temperature undoped GaN layer,
   the defect exposure layer is a low temperature undoped GaN layer or a low temperature undoped InGaN layer,
   the defect termination layer is a doped GaN layer, and
   a doping concentration gradually increases in a stacked direction of the epitaxial structure, in the defect termination layer.

2. The epitaxial structure of claim 1, wherein the doped GaN layer is an island-shaped silicon-doped GaN layer or an island-shaped magnesium-doped GaN layer, and the doped GaN layer has the doping concentration greater than $10^{19}$ cm$^{-3}$.

3. The epitaxial structure of claim 1, further comprising:
   an n-type GaN layer, a light-emitting layer, an electron-blocking layer (EBL), and a p-type GaN layer which are sequentially stacked on the defect termination layer.

4. A light-emitting diode (LED), comprising an epitaxial structure comprising a sapphire substrate, a GaN layer, a defect exposure layer, and a defect termination layer stacked in sequence, wherein
   defects are generated in from the GaN layer caused by lattice constant mismatch between the GaN layer and sapphire substrate, and extend to the defect termination layer through the defect exposure layer,
   the defect exposure layer is configured to enlarge and expose the defects in the GaN layer,
   the defect termination layer is configured to change directions of the defects in the defect termination layer and stop the defects from expanding,
   the GaN layer is a high temperature undoped GaN layer,
   the defect exposure layer is a low temperature undoped GaN layer or a low temperature undoped InGaN layer,
   the defect termination layer is a doped GaN layer, and
   a doping concentration gradually increases in a stacked direction of the epitaxial structure, in the defect termination layer.

5. A method for preparing an epitaxial structure, comprising:
   preparing a sapphire substrate of the epitaxial structure, and growing a GaN layer of the epitaxial structure on the sapphire substrate;
   growing a defect exposure layer of the epitaxial structure on the GaN layer; and
   growing a defect termination layer of the epitaxial structure on the defect exposure layer, wherein
   defects are generated in from the GaN layer caused by lattice constant mismatch between the GaN layer and sapphire substrate, and extend to the defect termination layer through the defect exposure layer,
   the defect exposure layer enlarges and exposes the defects in the GaN layer,
   the defect termination layer changes directions of the defects in the defect termination layer and stops the defects from expanding, and
   the GaN layer is a high temperature undoped GaN layer,
   the defect exposure layer is a low temperature undoped GaN layer or a low temperature undoped InGaN layer,
   the defect termination layer is a doped GaN layer, and a doping concentration gradually increases in a stacked direction of the epitaxial structure, in the defect termination layer.

6. The method for preparing the epitaxial structure of claim 5, wherein growing the GaN layer on the sapphire substrate comprises:
   growing amorphous GaN on the sapphire substrate;
   performing heat treatment on the amorphous GaN to obtain single crystal GaN, wherein the heat treatment is performed at a temperature of 950° C.-1050° C.; and
   growing the GaN layer by using the single crystal GaN as a seed crystal.

7. The method for preparing the epitaxial structure of claim 5, wherein growing the defect exposure layer on the GaN layer comprises:
   growing GaN or InGaN on the GaN layer to obtain the defect exposure layer, wherein the GaN or InGaN is grown at a temperature of 600° C.-800° C. and with a V-III ratio of 1000-2500; and
   growing the defect termination layer on the defect exposure layer comprises:
   growing doped GaN on the defect exposure layer to obtain the defect termination layer, wherein the doped GaN is grown at a temperature of 1000° C.-1100° C. and with a V-III ratio of 4500-7500.

8. The method for preparing the epitaxial structure of claim 7, wherein silicon or magnesium is dopted in growing of the doped GaN, and the doped GaN has the doping concentration greater than $10^{19}$ cm$^{-3}$.

9. The method for preparing the epitaxial structure of claim 5, further comprising:
   growing sequentially on the defect termination layer an n-type GaN layer, a light-emitting layer, an electron-blocking layer (EBL), and a p-type GaN layer.

10. The epitaxial structure of claim 1, wherein the low temperature undoped InGaN layer is In$_x$Ga$_{1-x}$N (0.2≤x≤0.35).

11. The epitaxial structure of claim 2, wherein a silicon source of the island-shaped silicon-doped GaN layer is silane (SiH$_4$), and a magnesium source of the island-shaped magnesium-doped GaN layer is magnesium cerene (Cp$_2$Mg).

12. The LED of claim 4, wherein the doped GaN layer is an island-shaped silicon-doped GaN layer or an island-shaped magnesium-doped GaN layer, and the doped GaN layer has the doping concentration greater than $10^{19}$ cm$^{-3}$.

13. The LED of claim 4, wherein the epitaxial structure further comprises an n-type GaN layer, a light-emitting layer, an electron-blocking layer (EBL), and a p-type GaN layer which are sequentially stacked on the defect termination layer.

14. The LED of claim 4, wherein the low temperature undoped InGaN layer is In$_x$Ga$_{1-x}$N (0.2≤x≤0.35).

15. The LED of claim 12, wherein a silicon source of the island-shaped silicon-doped GaN layer is silane (SiH$_4$), and a magnesium source of the island-shaped magnesium-doped GaN layer is magnesium cerene (Cp$_2$Mg).

16. The method for preparing the epitaxial structure of claim 5, wherein the doped GaN layer is an island-shaped silicon-doped GaN layer or an island-shaped magnesium-doped GaN layer, and the doped GaN layer has the doping concentration greater than $10^{19}$ cm$^{-3}$.

17. The method for preparing the epitaxial structure of claim 5, wherein growing the defect exposure layer on the GaN layer comprises:
   growing GaN or InGaN on the GaN layer to obtain the defect exposure layer, wherein the GaN or InGaN is grown at a temperature of 600° C.-800° C., with a V-III ratio of 1000-2500, and under a growth pressure of 300 torr-400 torr, wherein an N source of the defect exposure layer is ammonia gas, a Ga source of the defect exposure layer is trimethylgallium or triethylgallium, and a In source of the defect exposure layer is trimethylindium.

18. The epitaxial structure of claim 1, wherein the defect exposure layer has a thickness in a range of 0.5 μm-1 μm.

19. The LED of claim 4, wherein the defect exposure layer has a thickness in a range of 0.5 μm-1 μm.

20. The method for preparing the epitaxial structure of claim 5, wherein the defect exposure layer has a thickness in a range of 0.5 μm-1 μm.

* * * * *